United States Patent [19]

Reedy et al.

[11] Patent Number: 5,027,171
[45] Date of Patent: Jun. 25, 1991

[54] DUAL POLARITY FLOATING GATE MOS ANALOG MEMORY DEVICE

[75] Inventors: Ronald E. Reedy; Randy L. Shimabukuro; Graham A. Garcia, all of San Diego, Calif.

[73] Assignee: The United States of America as represented by the Secretary of the Navy, Washington, D.C.

[21] Appl. No.: 405,498

[22] Filed: Aug. 28, 1989

[51] Int. Cl.$^5$ .................... H01L 29/78; G11C 11/34
[52] U.S. Cl. .................... 357/23.5; 357/23.4; 357/42; 365/182
[58] Field of Search .............. 357/23.4, 23.5, 42; 365/182

[56] References Cited

PUBLICATIONS

Shimabukuro et al.—1989 IEEE International Symposium on Circuits and Systems, Proceedings, vol. 2, IEEE, May 8-11, 1989.
Shoemaker et al.—"Artificial Neural Network Implementation with Floating Gate MOS Devices"—Hardware Implementation of Neuron Nets and Synapses, Workshop sponsored by NSF and ONR, Jan. 14-15, 1988.

*Primary Examiner*—Edward J. Wojciechowicz
*Attorney, Agent, or Firm*—Harvey Fendelman; Thomas Glenn Keough; Michael A. Kagan

[57] ABSTRACT

A dual-polarity nonvolatile MOS analog memory cell is disclosed that comprises two pairs of complementary metal oxide field effect transistors. Each pair includes a p-channel and an n-channel transistor. The gates of each transistor are all operably coupled in common to form a common floating gate. The sources of the transistors of the first transistor pair are operably coupled to a common ground. The sources of the second pair of transistors are operably coupled together to form an output junction. Positive voltage applied to the drain of the n-channel transistor of the first transistor pair causes a positive analog value to be stored in memory when there previously was no value stored in memory, or increases a value previously stored in memory. Negative voltage applied to the drain of the p-channel transistor of the first transistor pair causes a negative analog value to be stored in memory when there previously was no value stored in memory, or decreases a value previously stored in memory.

18 Claims, 2 Drawing Sheets ns of the floating gate, the floating gate, providing electric charge stored on the cell. A certain amount of floating gate voltage can the attained by monitoring conductances the respective EEPROM MOSFET's. Since the thin gate oxide is different to fabricate, can result in low production yields. The performance of the device is sensitive to thickness variations which results in variations in writing characteristics between devices. Since the EEPROM uses a differential pair of devices to achieve positive and negative weights, the updating must be done by symmetrically adjusting both devices in the pair.
DUAL POLARITY FLOATING GATE MOS ANALOG MEMORY DEVICE

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION

The present invention relates to a dual polarity non-volatile MOS analog memory (MAM) cell.

There is currently a great deal of effort in implementing neural type networks in VLSI circuitry. Such implementation represents a practical way to realize the tremendous potential applications demonstrated in computer simulations.

A major part of any neural network is the weighting matrix, which stores the relative strengths of interconnections between processing units. Most useful applications require on the order of several thousand to several million weighting elements. In many networks these weights can be either excitatory (positive) or inhibitory (negative). In a learning network the weights must also be modifiable. Therefore, the ideal weighting element will have a long storage life time, be continuously adjustable, compact in size, and be able to store a positive or negative weight. Also, since many learning rules compute changes in weighting values, one would like to be able to update the weight in increments or decrements.

One type of non-volatile charge storing device is described in "FAMOS-A New Semiconductor Charge Storage Device," by Frohman-Bentchkowsky, D., *Solid-State Electronics*, Volume 17, pages 517–529, 1974. The structure of the device disclosed by this reference is a p-channel, silicon gate, field effect transistor in which no electric contact is made to the silicon gate. It combines the floating gate concept with avalanche injection of electrons from the surface depletion region of a p-n junction to yield reproducible charging characteristics with long term storage retention. FAMOS was intended to store digital weights and had to be erased by illumination with ultraviolet light.

Another device that provides non-volatile storage of data is described in "DIFMOS-A Floating-Gate Electrically Erasable Non-Volatile Semiconductor Memory Technology," by Gosney, W. M., *IEEE Transactions on Electron Devices*, Volume Ed-24, No. 5, May 1977. DIFMOS was intended to be used as digital device that provides an electrically alterable read only memory. The charge on the gate was limited only to non-positive values. DIFMOS also required a bootstrap capacitor with a 40 volt bias to erase charge on the gate.

A floating gate non-volatile memory device for storing analog information is described in "A Electrically Trainable Artificial Neural Network (ETANN) With 10240 Floating Gate Synapses," Holler, M., Tam, S., Castro, H., Benson, R., *IJCNN International Joint Conference on Neural Networks*, Vol. II, Washington D. C., pp. II-191 to II-196, 1989, published by the Institute of Electrical and Electronics Engineers, Inc., IEEE Catalog No. 89CH2765-6. This reference discloses a synapse cell circuit which is an NMOS version of a Gilbert-Multiplier. A pair of EEPROM cells are incorporated in which a differential voltage representing the weight may be stored or adjusted. Electrons are added to or removed from the floating gates of the EEPROM cells by Fowler-Nordheim tunneling. A desired differential floating gate voltage can be attained by monitoring the conductances of the respected EEPROM MOSFET's. This device uses a thin gate oxide which is difficult to fabricate, and can result in low production yields. The performance of this device is sensitive to thickness variations of the gate oxide which causes variations of writing characteristics between devices. Since the EEPROM uses a differential pair of devices to achieve positive and negative weights, the updating must be done by symmetrically adjusting both devices in the pair.

All of these devices are limited to storing only zero or negative charge on a floating gate. DIFMOS and FAMOS are digital devices that are not intended to store analog information. Although the ETANN synapse by INTEL can store analog information, it must be used in pairs of symmetrical synapses in order to achieve dual polarity outputs, making it difficult to change values stored in this device. Therefore, a need exists for a relatively simple non-volatile, dual polarity memory cell which can store analog information.

SUMMARY OF THE INVENTION

The present invention overcomes the limitations of earlier memory cells and enables both positive and negative analog values to be stored and modified in a non-volatile memory cell. Furthermore, the gate oxides of the present invention are relatively thick, providing good production yields of memory cells having predictable, repeatable performance in a mass production environment.

The invention includes a first complementary pair of MOSFET transistors operably coupled to a second complementary pair of MOSFET transistors by a common floating gate. The sources of the first pair of MOSFETs are grounded. The first pair of MOSFET's has sources which are grounded and drains that provide separate input paths which enable the charge stored on the floating gate to be incremented or decremented. The second pair of MOSFET's has sources that are operably coupled in common that provide an analog voltage output and has drains that receive voltage inputs which are equal in magnitude but opposite in polarity.

OBJECT OF THE INVENTION

An object of the present invention is to provide an integrated circuit element that permits long term storage of analog information without the need for electrical power during the storage period.

A second object of the present invention is to provide an integrated circuit element that permits long term storage of analog information which can be incremented or decremented.

Another object of the present invention is to provide an integrated circuit element that permits long term storage of analog information which can be incremented or decremented without first reading the analog value stored in the device.

Still another object of the present invention is to provide a non-volatile, integrated circuit memory cell that can store positive and negative analog data.

Still yet another object of the present invention is to provide a non-volatile, integrated circuit memory cell with an integrated readout that can alternatively store positive or negative analog data and provide access to the stored data.

These and other objects of the invention will become more readily apparent from the ensuing description and claims when considered in conjunction with the appended drawings.

DESCRIPTION OF THE PREFERRED EMBODIMENT

Figure 1:
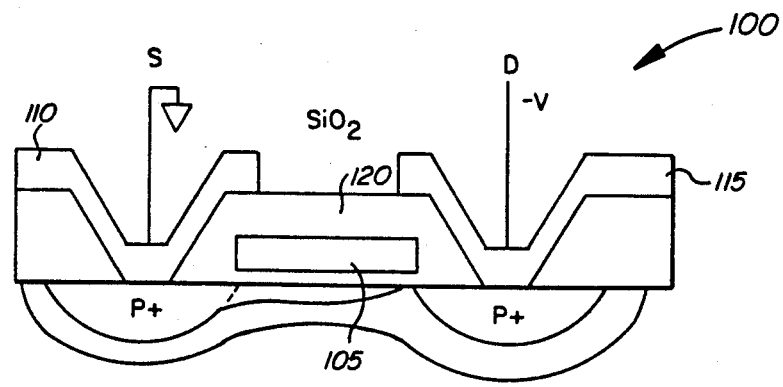
FIG. 1 is a cross-sectional view of a p-channel MOSFET with a floating silicon gate.

Background information which facilitates understanding the present invention is provided with reference to FIG. 1 which shows a cross-sectional view of p-channel MOSFET 100 having floating polysilicon gate 105. Source 110 is grounded and a negative potential is applied to drain 115. Above a critical voltage, avalanche multiplication occurs in the large electric field regions near drain 115. This process generates hot electrons with sufficient energy to conduct across oxide barrier 120 and charge up gate 105. The charge stored on floating gate 120 is isolated by surrounding insulating layer 120 which may be silicon dioxide. This provides an effective barrier against charge leakage. Earlier work by Gosney, sucra, suggests storage times at room temperature of more than ten years. A complementary process occurs in an n-channel device when a sufficiently large positive voltage is applied to the drain. In the latter case, however, holes rather than electrons are injected onto the gate.

Figure 2:
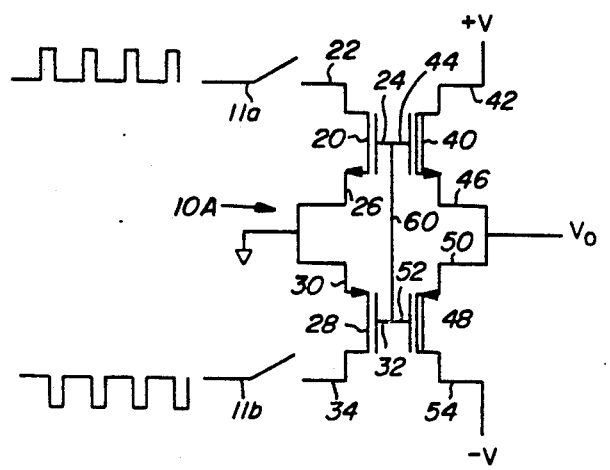
FIG. 2 is a schematic diagram of a first embodiment of the present invention.
Figure 3:
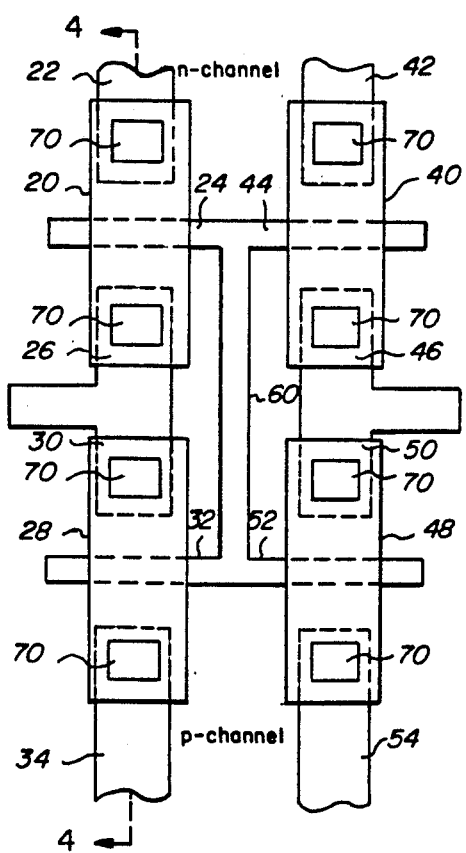
FIG. 3 is a plan view of the first embodiment of the present invention.

A schematic diagram of a first embodiment of the present invention is provided in FIG. 2 where there is shown MAM cell 10a having a complementary pair of MOSFET's comprising n-channel MOSFET 20 having drain 22, gate 24 and source 26 operably coupled to p-channel MOSFET 28 having source 30, gate 32 and drain 34. Sources 26 and 30 are electrically grounded. MOSFET's 20 and 28 are enhancement mode transistors. MAM cell 10a also includes a second pair of complementary MOSFET's comprising n-channel MOSFET 40 having drain 42, gate 44 and source 46 operably coupled to source 50 of p-channel MOSFET 48 having gate 52 and drain 54. MOSFET's 40 and 48 are both preferably depletion mode transistors, although they may also both be enhancement mode transistors. Gates 24, 44, 32 and 52 are operably connected in common and may be collectively referred to as common floating gate 60. A plan view of MAM cell 10a is illustrated in FIG. 3 which shows metal contacts 70 that provide electrical continuity to underlying MAM cell 10a.

MOSFET's 20 and 28 may collectively be referred to as the "write" transistors because charge, representing an analog value, may be placed on common gate 60 through them. MOSFET's 40 and 48 may be collectively referred to as the "read" transistors because the charge stored on gate 60 may be "read" in the form of voltage at the junction of commonly coupled sources 46 and and 50. A cross-sectional view of MOSFET's 20 and 28 is provided in FIG. 3. These MOSFET pairs are similarly fabricated in accordance with well known techniques such as those described in *VLSI Technology*, edited by S. M. Sze, McGraw-Hill Book Company, 1983. By way of example, MOSFET's 20 and 28 may be manufactured as described below.

Figure 4:
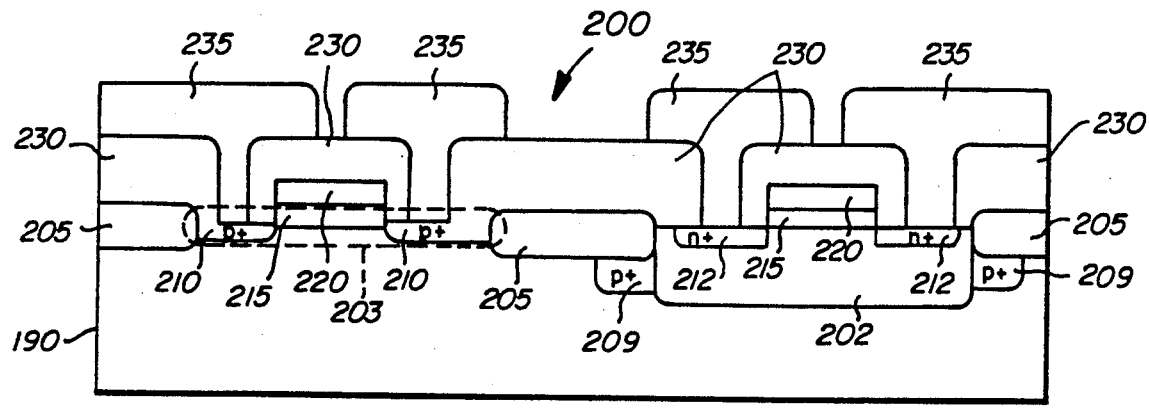
FIG. 4 is a cross-sectional view of the write MOSFET's of the first embodiment of the present invention.

The manufacture of MOSFET's (write transistors) 20 and 28, illustrated in cross-section in FIG. 4, is commenced by masking the surface of n-type bulk silicon 190 with a pattern that is developed to expose regions within silicon 190 which are to become p-well region 202. For convenience, the structure resulting from each step of the manufacturing processes applied to silicon 190 will be referred to as wafer 200. Boron is ion implanted into the surface of silicon 190 to form p-well region 202 and then, the boron is diffused and activated into bulk silicon 190 by a thermal drive in a furnace. Silicon nitride (not shown) is deposited over wafer 200 and patterned to expose areas 205. Wafer 200 is masked by a pattern to expose regions 210. Boron is ion implanted into regions 209 which become p+ guard bands. Field oxide 205 is grown on wafer 200 over regions 205. The nitride layer is completely stripped away. Threshold adjust masking and implants are performed to active regions 202 and 203 to establish the threshold voltages of MOSFET's 20 and 28. Next, gate oxide 215 is grown over wafer 200. Polysilicon is deposited over wafer 200 and then is patterned and etched to form gates 220. Source/drain n+ regions 212 and p+ regions 210 are patterned and selectively doped with n-type dopant such as arsenic or a p-type dopant such as boron, respectively, to form the sources and drains of MOSFET's 20 and 28. Contact oxide 230 then is deposited over wafer 200. The n+ and p+ regions 212 and 210, respectively, are activated and annealed at an elevated temperature. Contact oxide 230 is patterned and etched to open contact holes over p+ regions 210 and n+ regions 212. Metal, such as aluminum, is deposited over wafer 200 and then patterned and selectively etched to form metal interconnections 235. In the preferred, embodiment passivation oxide (not shown) is deposited over wafer 200 and then is selectively etched to expose metal inter-connections 235 where external connections are to be made to wafer 200. Alternatively, MAM cell 10a may be manufactured by using silicon-on-insulator rather than bulk silicon 190 in accordance with processing techniques that are well known to those of ordinary skill in this field of technology.

Figure 5:
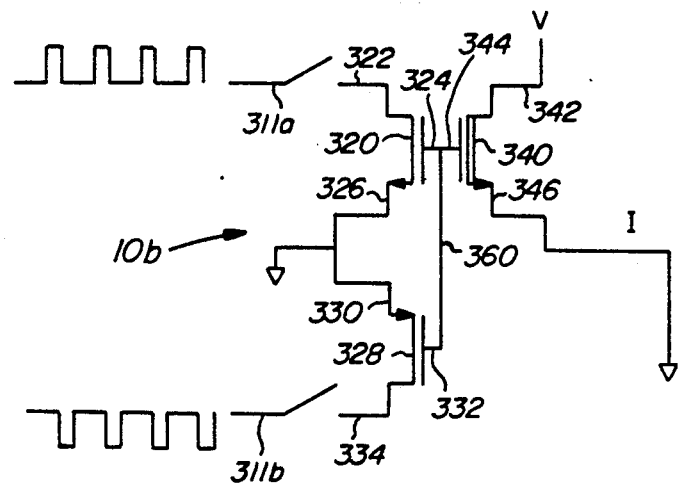
FIG. 5 is a schematic diagram of a second embodiment of the present invention.

The operation of MAM cell 10a is best understood with reference to FIG. 2. MOSFET's 20 and 28 are used to write charge to common gate 60. A positive pulse provide through switch 11a to drain 22 of n-channel MOSFET 20 injects a burst of holes, charging gate 60 more positively, and a negative pulse provided through switch 11b to drain 34 of p-channel transistor 28 injects electrons, charging gate 60 more negatively. A positive voltage, +V, is applied to drain 42 and a negative voltage, −V, is applied to drain 54, where in the preferred embodiment, $|-V| = |30 \text{ V}|$. The potential of gate 60 affects the conductance of the read MOSFET's 40 and 48, making the output voltage proportional to the charge stored on common gate 60. The analog voltage output, $V_o$, available at the junction of sources 46 and 50, is such that $-V \leq V_o V_o$, as shown in FIG. 5. While a single complementary pair of MOSFETs could be used for both reading and writing, the present invention isolates these two functions to optimize each one independently in order to allow the possibility of simultaneous reading and writing.

Read MOSFET's 40 and 48 may be manufactured according to the process steps described above, except that when doing the threshold adjust implants, the dose and type of dopant used makes MOSFET's 40 and 48 depletion mode devices. For p-channel MOSFET 48, the threshold adjust implant is a p-type dopant such as boron. For n-channel MOSFET 40, the threshold adjust implant is an n-type dopant such as arsenic.

In a second embodiment of the present invention, illustrated in FIG. 5, there is shown MAM cell 10b that includes a complementary pair of MOSFET's comprising n-channel MOSFET 320 having drain 322, gate 324 and source 326 operably coupled to p-channel MOSFET 328 having source 330, gate 332 and drain 334. Sources 326 and 330 are electrically grounded. MOSFET's 320 and 328 are enhancement mode transistors. MAM cell 10b also includes n-channel MOSFET 340 having drain 342, gate 344 and source 346 which may be operably coupled to ground, as shown, or to another circuit. MOSFET 340 may be either an enhancement or preferably a depletion mode transistor. Gates 324, 344, and 332 are operably connected in common and may be collectively referred to as common floating gate 60.

Figure 6:
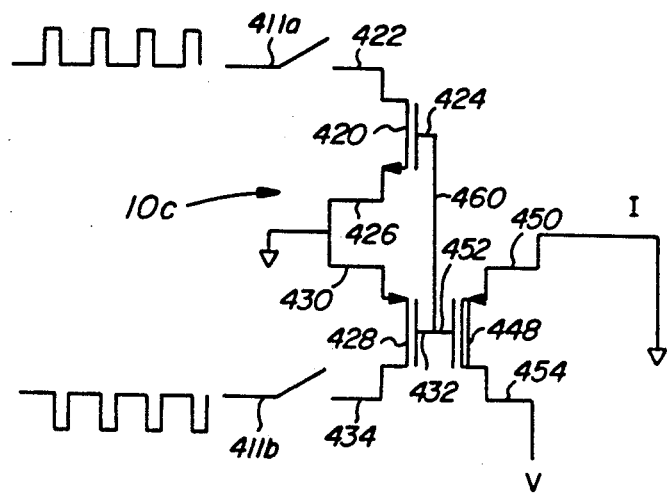
FIG. 6 is a schematic diagram of a third embodiment of the present invention.

A third embodiment of the present invention is depicted in FIG. 6, where there is shown MAM cell 10c that includes a complementary pair of MOSFET's comprising n-channel MOSFET 420 having drain 422, gate 424 and source 426 operably coupled to p-channel MOSFET 428 having source 430, gate 432 and drain 434. Drains 426 and 430 are electrically grounded. MOSFET's 420 and 428 are enhancement mode transistors. MAM cell 10c also includes p-channel MOSFET 448 having drain 454, gate 452 and source 450 which may be operably coupled ground, as shown, or to another circuit. MOSFET 448 may be an enhancement or preferably a depletion mode transistor. Gates 424, 432, and 452 are operably connected in common and may be collectively referred to as common floating gate 460.

MOSFET's 10b and 10c may be manufactured generally in accordance with the techniques described above regarding the fabrication of MAM cell 10a as are well known by those of ordinary skill in this field of technology.

MAM cells 10b and 10c operate similarly to the operation of MAM cell 10a, described above. With regard to MAM cell 10b, MOSFET's 320 and 328 are used to write charge to common gate 360. A positive pulse through switch 311a to drain 322 of n-channel MOSFET 320 ejects a burst of holes, charging gate 360 more positively, and a negative pulse applied through switch 311b to drain 334 of p-channel MOSFET 328 injects electrons, charging gate 360 more negatively. A voltage, V, is applied to drain 342. The potential of gate 360 affects the conductance of the read MOSFET 340, making the output current through source 346 (as opposed to voltage output for MAM cell 10a) proportional to the charge stored on common gate 460. However, the output of MAM cell 10b is of single polarity only.

With regard to MAM cell 10c, illustrated in FIG. 6, MOSFET's 420 and 428 are used to write charge to common gate 460. A positive pulse through switch 41a to drain 422 of n-channel MOSFET 420 ejects a burst of holes, charging gate 460 more positively, and a negative pulse applied through switch 411b to drain 434 of p-channel MOSFET 428 infects electrons, charging gate 460 more negatively. A voltage, V, is applied to drain 454. The potential of gate 460 affects the conductance of the read MOSFET 448, making the output current through source 450 (as opposed to voltage output for MAM cell 10a) proportional to the charge stored on common gate 460. As for MAM cell 10b, the output of MAM cell 10c is of single polarity only.

Obviously, many modifications and variations of the present invention are possible in light of the above teachings. It is therefore to be understood that within the scope of the appended claims the invention may be practiced otherwise than as specifically described.

We claim:

1. A dual-polarity nonvolatile MOS analog memory cell, comprising:
    first and second n-channel metal oxide field effect transistors each having a gate, a source, and a drain; and
    first and second p-channel metal oxide field effect transistors each having a gate, a source, and a drain, where
    said gates of each of said first and second n-channel transistors and said first and second p-channel transistors being operably coupled in common to form a common floating gate, said sources of said first n-channel and p-channel transistors being operably coupled to a common ground, said sources of said second n-channel and p-channel transistors being operably coupled together to form an output junction.

2. The dual-polarity nonvolatile MOS analog memory cell of claim 1 wherein:
    said first n-channel and p-channel transistors are enhancement mode transistors.

3. The dual-polarity nonvolatile MOS analog memory cell of claim 1 wherein:
    said second n-channel and p-channel transistors are depletion mode transistors.

4. The dual-polarity nonvolatile MOS analog memory cell of claim 1 wherein:
    said second n-channel and p-channel transistors are enhancement mode transistors.

5. A process for storing both positive and negative analog nonvolatile data comprising the steps of:
    applying a positive voltage to a positive voltage input of a dual-polarity, nonvolatile metal oxide memory cell in order to store an analog value in said memory cell when no analog value is stored in said memory cell, said memory cell comprising:
    a first n-channel metal oxide field effect transistor having a gate, a source, and a drain, said drain being said positive voltage input;
    a first p-channel metal oxide field effect transistor having a gate, a source, and a drain;
    a second n-channel metal oxide field effect transistor having a gate, a source, and a drain;
    a second p-channel metal oxide field effect transistor having a gate, a source, and a drain, where
    said gates of each of said first and second n-channel transistors and said first and second p-channel transistors being operably coupled in common to form a common floating gate, said sources of said first n-channel and p-channel transistors being operably coupled to a common ground, said sources of said second n-channel and p-channel transistors being operably coupled together to form an output junction.

6. A process for storing nonvolatile analog data comprising the steps of:

applying a negative voltage to the negative voltage input of a dual-polarity, nonvolatile metal oxide memory cell in order to store an analog value in said memory cell when no analog value is stored in said memory cell, said memory cell comprising:

a first n-channel metal oxide field effect transistor having a gate, a source, and a drain;

a first p-channel metal oxide field effect transistor having a gate, a source, and a drain, said drain being said negative voltage input;

a second n-channel metal oxide field effect transistor having a gate, a source, and a drain; and a second p-channel metal oxide field effect transistor having a gate, a source, and a drain; where said gates of each of said first and second n-channel transistors and said first and second p-channel transistors being operably coupled in common to form a common floating gate, said sources of said first n-channel and p-channel transistors being operably coupled to a common ground, said sources of said second n-channel and p-channel transistors being operably coupled together to form an output junction.

7. A process for varying nonvolatile analog data stored in a memory cell, comprising the steps of:

applying a positive voltage to the positive voltage input of a dual-polarity nonvolatile metal oxide memory cell in order to increase an analog value stored in said memory cell, said memory cell comprising:

a first n-channel metal oxide field effect transistor having a gate, a source, and a drain, said drain being said positive voltage input;

a first p-channel metal oxide field effect transistor having a gate, a source, and a drain;

a second n-channel metal oxide field effect transistor having a gate, a source, and a drain; and a second p-channel metal oxide field effect transistor having a gate, a source, and a drain, where said gates of each of said first and second n-channel transistor and said first and second p-channel transistors being operably coupled in common to form a common floating gate, said sources of said first n-channel and p-channel transistors being operably coupled to a common ground, said sources of said second n-channel and p-channel transistors being operably coupled together to form an output junction.

8. A process for varying nonvolatile analog data stored in a memory cell, comprising the steps of:

applying a negative voltage to the negative voltage input of a dual-polarity nonvolatile metal oxide memory cell in order to decrease an analog value stored in said memory cell, said memory cell comprising:

a first n-channel metal oxide field effect transistor having a gate, a source, and a drain;

a first p-channel metal oxide field effect transistor having a gate, a source, and a drain, said drain being said negative voltage input;

a second n-channel metal oxide field effect transistor having a gate, a source, and a drain; and a second p-channel metal oxide field effect transistor having a gate, a source, and a drain; where said gates of each of said first and second n-channel transistors and said first and second p-channel transistors being operably coupled in common to form a common floating gate, said sources of said first n-channel and p-channel transistors being operably coupled to a common ground, said sources of said second n-channel and p-channel transistors being operably coupled together to form an output junction.

9. The process of claim 5, 6, 7, or 8 wherein the step of applying said voltage includes:

applying voltage pulses for a predetermined period of time.

10. The process of claim 5, 6, 7, or 8 wherein the step of applying said voltage includes:

applying a direct current voltage for a predetermined period of time.

11. A nonvolatile MOS analog memory cell, comprising:

first and second n-channel metal oxide field effect transistors each having a gate, a source, and a drain; and a p-channel metal oxide field effect transistor having a gate, a source, and a drain, where said gates of each of said first and second n-channel transistors and said first p-channel transistor being operably coupled in common to form a common floating gate, said sources of said first n-channel and said p-channel transistors being operably coupled to a common ground.

12. The nonvolatile MOS analog memory cell of claim 11 wherein:

said first n-channel and said p-channel transistors are enhancement mode transistors.

13. The nonvolatile MOS analog memory cell of claim 12 wherein:

said second n-channel transistor is a depletion mode transistor.

14. The nonvolatile MOS analog memory cell of claim 12 wherein:

said second n-channel transistor is an enhancement mode transistor.

15. A nonvolatile MOS analog memory cell, comprising:

an n-channel metal oxide field effect transistor having a gate, a source, and a drain; and first and second p-channel metal oxide field effect transistors each having a gate, a source, and a drain, where said gates of said n-channel transistor and said first and second p-channel transistors being operably coupled in common to form a common floating gate, said sources of said n-channel and said first p-channel transistor being operably coupled to a common ground.

16. The nonvolatile MOS analog memory cell of claim 15 wherein:

said n-channel and said first p-channel transistors are enhancement mode transistors.

17. The nonvolatile MOS analog memory cell of claim 16 wherein:

said second p-channel transistor is a depletion mode transistor.

18. The nonvolatile MOS analog memory cell of claim 16 wherein:

said second p-channel transistor is an enhancement mode transistor.

* * * * *

UNITED STATES PATENT AND TRADEMARK OFFICE
CERTIFICATE OF CORRECTION

PATENT NO. : 5,027,171
DATED : 25 June 1991
INVENTOR(S) : Ronald E. Reedy, Randy L. Shimabukuro, and Graham A. Garcia It is certified that error appears in the above-identified patent and that said Letters Patent is hereby corrected as shown below:

Column 4: line 61:
Change "$|30\ V|$" to --$|+V|$--.

Column 4: line 66:
Change "$V_o V_o$" to --$V_o \leq V$--

Signed and Sealed this

Twenty-sixth Day of January, 1993

Attest:

STEPHEN G. KUNIN

*Attesting Officer*    Acting Commissioner of Patents and Trademarks